United States Patent
Davidi et al.

(10) Patent No.: US 10,599,802 B2
(45) Date of Patent: Mar. 24, 2020

(54) METHODS FOR AUTOMATIC ENGINEERING CHANGE ORDER (ECO) BUG FIXING IN INTEGRATED CIRCUIT DESIGN

(71) Applicant: MELLANOX TECHNOLOGIES, LTD., Yokneam (IL)

(72) Inventors: Or Davidi, Reut (IL); Roy Armoni, Givat Ada (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 16/010,536

(22) Filed: Jun. 18, 2018

(65) Prior Publication Data

US 2019/0384867 A1    Dec. 19, 2019

(51) Int. Cl.
*G06F 17/50* (2006.01)

(52) U.S. Cl.
CPC .................. *G06F 17/505* (2013.01)

(58) Field of Classification Search
CPC .................................................. G06F 17/505
USPC .................................................. 716/103, 139
See application file for complete search history.

(56) References Cited

U.S. PATENT DOCUMENTS

| | | | |
|---|---|---|---|
| 5,953,236 A | 9/1999 | Hossain et al. | |
| 6,014,506 A | 1/2000 | Hossain et al. | |
| 6,226,777 B1 | 5/2001 | Zhang | |
| 6,453,449 B1 | 9/2002 | Wada | |
| 6,453,454 B1 | 9/2002 | Lee et al. | |
| 6,530,073 B2 * | 3/2003 | Morgan | G06F 17/5045 716/102 |
| 6,691,286 B1 * | 2/2004 | McElvain | G06F 17/5022 702/109 |
| 6,779,170 B1 * | 8/2004 | Montrym | G06F 17/5027 326/40 |
| 7,007,248 B2 | 2/2006 | Blinne et al. | |
| 7,231,626 B2 | 6/2007 | Hoff et al. | |
| 7,454,731 B2 | 11/2008 | Oh et al. | |
| 7,644,382 B2 * | 1/2010 | Budumuru | G06F 17/504 716/103 |
| 7,962,876 B2 | 6/2011 | Oh et al. | |

(Continued)

OTHER PUBLICATIONS

Armoni et al., U.S. Appl. No. 15/387,958, filed Dec. 22, 2016.

(Continued)

*Primary Examiner* — Stacy Whitmore
(74) *Attorney, Agent, or Firm* — Kligler & Associates Patent Attorneys Ltd

(57) ABSTRACT

An apparatus for IC design includes a memory configured to store an original Register Transfer Level (RTL) model, a corrected RTL model, and a translation of the original RTL model into a netlist. A processor is configured to identify in the original RTL model a flip-flop having a next-state function that is not equivalent to a corresponding next-state function of a corresponding flip-flop in the Corrected RTL model, to find a wire, which is the earliest ancestor of the flip-flop for which there is no equivalence between the original RTL model and the corrected RTL model, to check whether the wire has an equivalent net in the netlist, to identify, upon finding that the wire has no equivalent net, one or more ancestors of the wire, which do have equivalent nets in the netlist, and to modify the netlist to match the corrected RTL model.

12 Claims, 3 Drawing Sheets

(56) References Cited

U.S. PATENT DOCUMENTS

| | | | |
|---|---|---|---|
| 8,122,400 B2* | 2/2012 | Hopkins | G06F 17/505 716/100 |
| 8,296,695 B1 | 10/2012 | Chen et al. | |
| 8,370,788 B2* | 2/2013 | Lo | G06F 17/5045 716/102 |
| 8,799,838 B2* | 8/2014 | Tanimoto | G06F 17/5045 716/107 |
| 9,477,805 B2 | 10/2016 | Bencivenga et al. | |
| 9,576,091 B1 | 2/2017 | Evans et al. | |
| 9,817,929 B1 | 11/2017 | Chauhan et al. | |
| 2002/0129325 A1 | 9/2002 | Tanaka | |
| 2002/0162086 A1* | 10/2002 | Morgan | G06F 17/5045 716/102 |
| 2003/0172045 A1* | 9/2003 | Rindner | G06F 16/258 |
| 2006/0010342 A1 | 1/2006 | Kanamaru | |
| 2006/0225008 A1 | 10/2006 | Schleicher, II et al. | |
| 2007/0271537 A1* | 11/2007 | Budumuru | G06F 17/504 716/103 |
| 2008/0127014 A1 | 5/2008 | Pandey et al. | |
| 2008/0127015 A1 | 5/2008 | Chandramouli et al. | |
| 2008/0222595 A1 | 9/2008 | Hsin | |
| 2010/0281443 A1* | 11/2010 | Lo | G06F 17/5045 716/136 |
| 2011/0004857 A1* | 1/2011 | Hopkins | G06F 17/505 716/104 |
| 2012/0054698 A1* | 3/2012 | Arbel | G06F 17/505 716/102 |
| 2012/0278771 A1 | 11/2012 | Ren | |
| 2013/0227505 A1* | 8/2013 | Tanimoto | G06F 17/504 716/107 |
| 2014/0129998 A1* | 5/2014 | Shrivastava | G06F 17/504 716/103 |
| 2016/0328506 A1 | 11/2016 | Shupe | |
| 2017/0083650 A1* | 3/2017 | Ashar | G06F 17/5027 |
| 2018/0181683 A1* | 6/2018 | Armoni | G06F 17/5022 |
| 2019/0163844 A1* | 5/2019 | Davidi | G06F 17/505 |

OTHER PUBLICATIONS

Lubyanutsky et al., "Cone Resynthesis ECO Methodology for Multi-Million Gate Designs", 22nd International Conference on VLSI Design, 5 pages, year 2009.

Jayalakshmi., "Auto ECO Flow Development For Functional ECO Using Efficient Error Rectification Method Based On FV Tool", Intel Corporation, 22 Pages, year 2009.

Golson et al., "The Human ECO Compiler", Synopsys Users Group (SNUG), San Jose, 57 pages, Mar. 21, 2004.

U.S. Appl. No. 15/822,241 office action dated Apr. 30, 2019.

* cited by examiner

METHODS FOR AUTOMATIC ENGINEERING CHANGE ORDER (ECO) BUG FIXING IN INTEGRATED CIRCUIT DESIGN

FIELD OF THE INVENTION

The present invention relates generally to design of integrated circuits, and, specifically to automatic modification of integrated circuit netlists.

BACKGROUND OF THE INVENTION

In VLSI design, the translation of the Register Transfer Level (RTL) to a netlist is typically done by complex VLSI-Synthesis software tools. When the RTL source is large, for example when complex System-On-Chip (SOC) integrated circuits are designed, synthesis becomes a long and tedious process. Therefore, if modifications to the RTL are introduced after synthesis is done, an Engineering Change Order (ECO) procedure is often preferred over a re-run of the synthesis tool. An example of ECO implementation techniques is given by Golson, in "The Human ECO Compiler," Synopsys Users Group (SNUG), San Jose, 2004.

SUMMARY OF THE INVENTION

An embodiment of the present invention that is described herein provides an apparatus for Integrated Circuit (IC) design, including a memory and a processor. The memory is configured to store an original Register Transfer Level (RTL) model of at least part of the IC, a corrected RTL model of the at least part of the IC, and a translation of the original RTL model into a netlist. The processor is configured to identify in the original RTL model a flip-flop having a next-state function that is not equivalent to a corresponding next-state function of a corresponding flip-flop in the Corrected RTL model, to find a wire, which is the earliest ancestor wire of the identified flip-flop for which there is no equivalence between the original RTL model and the corrected RTL model, to check whether the found wire in the corrected RTL model has an equivalent net in the netlist, to identify, upon finding that the wire has no equivalent net in the netlist, one or more ancestor wires of the wire, which do have equivalent nets in the netlist, and to modify the netlist, at least at the equivalent nets, to match the corrected RTL model.

In an embodiment, the processor is configured to modify the netlist by executing one or more ECO-fix commands. In another embodiment, the processor is configured to identify the flip-flop by sequentially traversing the original RTL model. In yet another embodiment, the processor is configured to find the wire by recursively traversing a logic cone of the identified flip-flop in the original RTL model. In still another embodiment, the processor is configured to identify the ancestor wires of the wire by recursively traversing the original RTL model.

There is additionally provided, in accordance with an embodiment of the present invention, a method for Integrated Circuit (IC) design, including storing in a memory an original Register Transfer Level (RTL) model of at least part of the IC, a corrected RTL model of the at least part of the IC, and a translation of the original RTL model into a netlist. A flip-flop, having a next-state function that is not equivalent to a corresponding next-state function of a corresponding flip-flop in the Corrected RTL model, is identified in the original RTL model. A wire, which is the earliest ancestor wire of the identified flip-flop for which there is no equivalence between the original RTL model and the corrected RTL model, is found. A check is made as to whether the found wire in the corrected RTL model has an equivalent net in the netlist. Upon finding that the wire has no equivalent net in the netlist, one or more ancestor wires of the wire, which do have equivalent nets in the netlist, are identified. The netlist is modified, at least at the equivalent nets, to match the corrected RTL model.

There is further provided, in accordance with an embodiment of the present invention, a computer software product, the product including a tangible non-transitory computer-readable medium in which program instructions are stored, which instructions, when read by a processor, cause the processor to store in a memory an original Register Transfer Level (RTL) model of at least part of the IC, a corrected RTL model of the at least part of the IC, and a translation of the original RTL model into a netlist, to identify in the original RTL model a flip-flop having a next-state function that is not equivalent to a corresponding next-state function of a corresponding flip-flop in the Corrected RTL model, to find a wire, which is the earliest ancestor wire of the identified flip-flop for which there is no equivalence between the original RTL model and the corrected RTL model, to check whether the found wire in the corrected RTL model has an equivalent net in the netlist, to identify, upon finding that the wire has no equivalent net in the netlist, one or more ancestor wires of the wire, which do have equivalent nets in the netlist, and to modify the netlist, at least at the equivalent nets, to match the corrected RTL model.

The present invention will be more fully understood from the following detailed description of the embodiments thereof, taken together with the drawings in which:

DETAILED DESCRIPTION OF EMBODIMENTS

Overview

Figure 1:
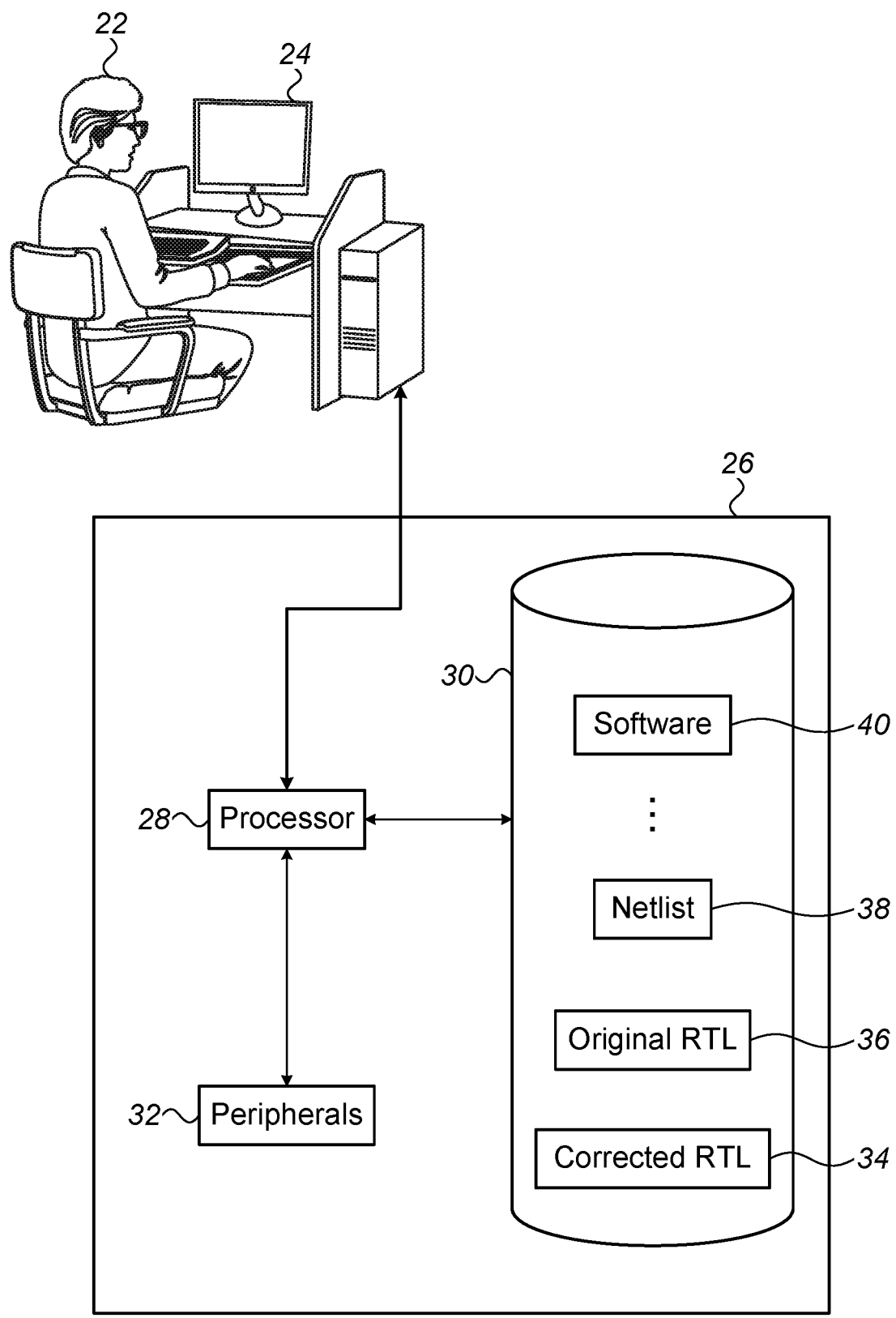
FIG. 1 is a block diagram that schematically illustrates a system for automatic ECO bug fixing, in accordance with embodiments of the present invention.

Translation of the RTL to a netlist is conventionally done by complex VLSI Synthesis software tools, for example Synopsys Design Compiler (DC). For large RTL designs, synthesis becomes long and tedious, requiring considerable computing resources and a long period of time. To save time, synthesis is often done in parallel to the last RTL level logic simulations. If problems are found while the synthesis is executing or after the synthesis is done, the designer typically tries to avoid rerunning the synthesis. Instead, an engineering change order (ECO) procedure is often preferred, wherein bugs that are discovered are corrected directly at the netlist level, without re-synthesis.

ECO implementation is error-prone when done manually and may take a relatively long time. Embodiments of the present invention automate the ECO bug fixing procedure, significantly reducing the probability to introduce errors in the ECO procedure, and shortening the ECO implementation time.

Prior to the description of the disclosed techniques, we will define some of the terms, which will be used in the descriptions and the claims hereinbelow.

A Register-Transfer Level (RTL) model of the integrated circuit (or of parts thereof) is a design abstraction which models a synchronous digital circuit in terms of the flow of digital signals between hardware registers, and the logical operations performed on those signals. Each of the registers in the RTL model has a Next_state input, and it may change its logic state to the logic value of the Next_state input following an edge in a global clock signal. In the descriptions below, and in the pursuing claims, we will refer to registers of the RTL model as Flip-Flops, and to the corresponding global clock as Clock. For simplicity, the clock may be omitted in the descriptions herein. Other logic functions which may be defined in the RTL model will be referred to as Wires, wherein each Wire of the RTL model is defined as a logic function of flip-flops, inputs and other wires.

A Logic Cone of a Flip-Flop in the RTL model is defined herein as a portion of the RTL model, comprising all wires that the Next-State input of the Flip-Flop refers to, and recursively to wires that the functions of the said wires refer to, down to Flip-Flops and inputs of the RTL model. Wires that are referenced in the definition of other wires will be referred to hereinbelow as Ancestor Wires, or Ancestors.

Another abstraction level of the integrated circuit design is the Netlist. A Netlist is a description of the connectivity of the integrated circuit. In the context of the present description and the claims, a Netlist comprises a list of the electronic components in the integrated circuit and a list of the nodes that the electronic components are connected to.

Synthesis is the process of translating an RTL model to a Netlist model (synthesis may comprise other functions, such as timing and power analysis; in the framework of the description and claims hereinbelow we will refer to the translation from RTL to Netlist only). Synthesis is done by automatic tools (for example—Synopsys Design Compiler). Nodes of the netlist model may correspond directly to wires in the RTL model; however, as the synthesis process comprises various optimization phases, there may be wires in the RTL model that do not have corresponding nodes in the netlist, and there may be nodes in the netlist that do not have corresponding wires in the RTL model.

Formal Equivalence-Check (Equivalence Check) is a test that formally proves that two representations of a circuit design exhibit the same behavior. Equivalence Check is typically carried out by a Formal Verification software tool.

Wire to Net (WIRE2NET) is a software tool that associates nets in the netlist to nodes in the RTL. An example to WIRE2NET is described in "A Method and an Apparatus for Finding Logic Equivalence between RTL and Post Synthesis Nets," U.S. patent application Ser. No. 15/387,958, whose disclosure is incorporated herein by reference. As the synthesis process comprises various optimization phases, there may be cases wherein WIRE2NET will not find associated nodes.

The term Direct Netlist Modification will refer to the modifications of the netlist that are not done by re-synthesis. A user may execute Direct Netlist Modification by textual editing of the netlist, or by using ECO FIX commands, which are available from several software vendors, and facilitate network modification using simple script commands, or by other means.

Embodiments of the present invention automate the ECO process, largely reducing the probability for an error and shortening the time to fix the bug. According to an embodiment, a user provides an "Original RTL," a "Corrected RTL" with the bug fixed, and a "Netlist," which has been prepared by synthesizing the Original RTL.

There is provided, according to embodiments of the present invention, methods and systems that automatically fix the bug in the netlist by:
 i) sequentially comparing the next-state functions of all flip-flops in the Original RTL to the next-state functions of the corresponding flip-flops in the Corrected RTL, using, for example formal-verification equivalence checks (other suitable tools may be used);
 ii) when a next-state function of a flip-flop in the Corrected RTL is not equal to the next-state function of the corresponding flip-flop in the Original RTL—comparing the wires in the cones of the flip-flop in the Corrected RTL with those of the Original RTL, disregarding the wires that do not have an equivalent net in the netlist, and starting from bottom (that is—outputs of flip-flops and external inputs);
 iii) when, in ii), a wire in the Corrected RTL is not equivalent to a corresponding wire in the Original RTL, finding a FIX-Location by getting its netlist equivalent (using, for example WIRE2NET; other suitable software tools may be used), and verifying that the fanout of the wire in the netlist is identical to the fanout in the RTL;
 iv) if the wire does not exist in the netlist—recursively checking Ancestor Wires of the wire, until a full set of the Ancestors of the wire is identified in the Netlist; and
 v) implementing the bug fix using Direct Netlist Modification.

The methods and apparatuses for ECO bug fixing described herein are automatic and are typically executed by a processor. Thus, bug fixing according to embodiments of the present invention may be more resilient to errors that may be accidentally inserted when ECO bug fix is done manually. In addition, the bug fixing time may be considerably shorter.

System Description

FIG. 1 is a block diagram that schematically illustrates a System 20 for the insertion of ECO Bug fixes into the design of an integrated circuit, in accordance with an embodiment of the invention.

System 20 comprises a User 22, such as a VLSI circuit designer, who interacts through a User Interface 24 with a Computer 26, which further comprises a Processor 28, a Memory 30 and Peripherals 32.

Alternatively, the functions of computer 26 that are described herein may be distributed among two or more separate computers. The functions of computer 26 are typically implemented in software, which runs on processor 28. The software may be downloaded to processor 28 in electronic form, over a network, for example. Additionally or alternatively, the software may be stored on non-transitory, tangible media, such as optical, magnetic or electronic memory media.

Memory 30 of computer 26 may store, permanently or temporarily, an Original RTL 34, which is a model of the integrated circuit which may include one or more bugs (i.e., design errors); a Corrected RTL 36, which is a model of the integrated circuit with the bugs corrected; a Netlist 38, which is a description of the connectivity of the integrated circuit corresponding to Original RTL 34 (that had typically been generated by running synthesis software on Original RTL 34), and Software Programs 40, which typically comprise a synthesis program, a NET2WIRE program, formal verification tools that can run equivalence tests, various scripting tools and/or other software.

According to embodiments of the present invention, Computer 26 runs a software program, which compares the next-state functions of all flip-flops of Original-RTL 34 with the next-state functions of the corresponding flip-flops of Corrected-RTL 36. The comparison may be done by running an Equivalence Test, using a formal verification tool. Other suitable programs may also be used.

Upon finding a flip-flop for which the next-state functions of the Original RTL and Corrected RTL are not equivalent, Computer 26 will scan the logic cones of the Flip Flop for which there is no equivalence, in the Original RTL and in the Corrected RTL, looking for a Fix Location. After finding a Fix Location, computer 26 will recursively scan the Netlist until it finds nets for all wires or ancestors of wires that are needed for the definition of the bug fix.

Upon finding all the nets in the network that are needed for the definition of the bug fix, Computer 26 may generate a series of ECO-Fix commands, to implement the bug fix directly in Netlist 38.

(The scan of the RTL and the scan of the Netlist, carried out by Computer 26 and mentioned hereinabove, will be described to detail in FIG. 3 below).

The computer system configuration shown in FIG. 1 is an example configuration that is depicted purely for the sake of conceptual clarity. Any other suitable configurations can be used in alternative embodiments. The different computer system elements may be implemented using suitable hardware, such as in one or more Application-Specific Integrated Circuit (ASIC) or Field-Programmable Gate Arrays (FPGA), using software, or using a combination of hardware and software elements.

Figure 2:
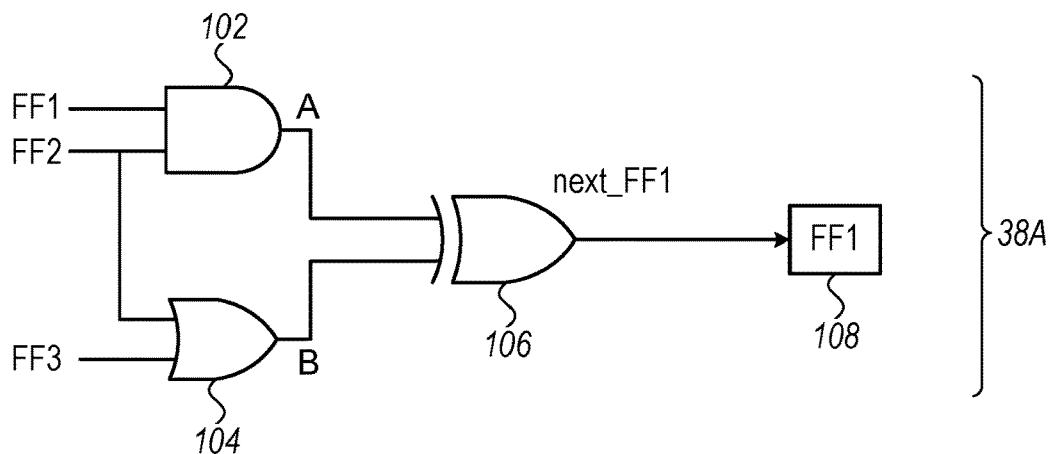
FIG. 2 is an illustration that schematically shows examples of an original-RTL, a corrected-RTL, an original netlist and a corrected netlist, according to an embodiment of the present invention.
Figure 2:
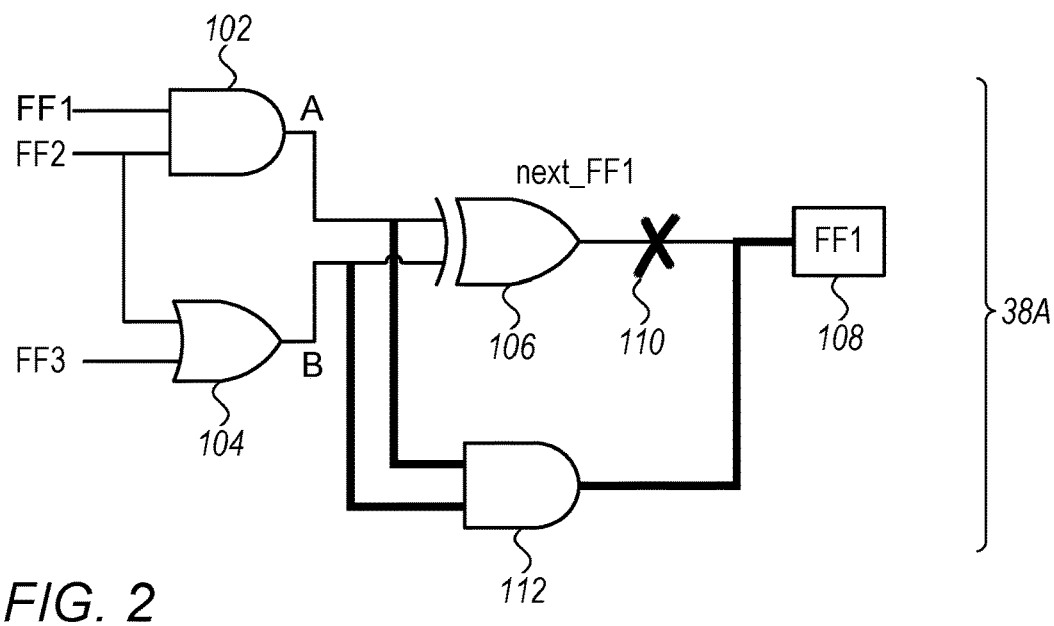

FIG. 2 is an illustration 100 that schematically shows examples of an original-RTL 34, a Corrected-RTL 36, an original netlist diagram 38A and a corrected netlist diagram 38B, according to embodiments of the present invention. Original Netlist diagram 38A is a diagram of a portion of an Original Netlist, which may have been generated by synthesis of Original RTL 34. Corrected Netlist Diagram 38B is a diagram of the netlist after the bug is fixed, according to some embodiments of the present invention. The Original-RTL, Corrected-RTL, original netlist diagram and corrected netlist diagram are typically stored in memory 30 and processed by processor 28 of FIG. 1 above.

Original RTL 34 is a portion of a model that is written in Verilog (other suitable logic modeling languages, e.g., VHDL, may be used), wherein a Wire A and a wire B are defined, and the logic equation of wires A and B are given as functions of flip-flops FF1, FF2, FF3 (not shown). Further, in Original-RTL 34, a next_FF1 wire is defined, wherein its logic equation is the Exclusive-OR of wires A and B; and, lastly, a Flip-Flop FF1 is defined, which sets it output to the logic value of next_FF1 wire upon a rising edge of its clock input (that is, its Next_state input is connected to next_FF1).

Corrected RTL 36 is a portion of a modified RTL. Corrected RTL 36 is identical to Original RTL 34, except that Next_FF1 in Corrected RTL 36 equals A&B, whereas in Original RTL 34, Next_FF1 equals A^B.

Original Netlist Diagram 38A comprises a NAND gate 102, having FF1 and FF2 as inputs and a wire A as output; an Or gate 104, having FF2 and FF3 as inputs and a wire B as output; a XOR gate 106, having wires A and B as inputs and a next_FF1 wire as output; and a flip-flop FF1 (108).

Corrected Netlist Diagram 38B illustrates the modification of the Original Netlist that are done, by processor 28, to fix the bug according to an embodiment of the present invention. Corrected Netlist Diagram 38B comprises the same And Gate 102, Or Gate 104, Xor Gate 106 and Flip-Flop 108 that are parts of Original Netlist 38A. According to embodiments of the present invention, when the Corrected Netlist is modified to fix the bug, a Cut 110 is inserted in Netlist 38B, disconnecting the next_FF1 wire from the Next_state input of FF1 108, and an AND Gate 112 is added, having wires A and B as inputs, and next_FF1 as output. The addition of Cut 110 and And Gate 112 implements the change, corresponding to the difference between Original RTL 34 and Corrected RTL 36.

In an embodiment the addition of Cut 110 or the addition of Gate 112 or both may be done using ECO-FIX commands. In some embodiments Xor gate 106 will be erased; in other embodiments Xor Gate 106 remains, but its output is not connected in Corrected Netlist 38B.

The illustration shown in FIG. 2 is an example that is depicted purely for the sake of conceptual clarity. RTL sources and Netlists in alternative embodiments may be substantially different; for example, the RTL may comprise embedded memory, or multi-clock flip-flops. ECO Fixing may be done in several ways, including manually, all as described in the claims.

Figure 3:
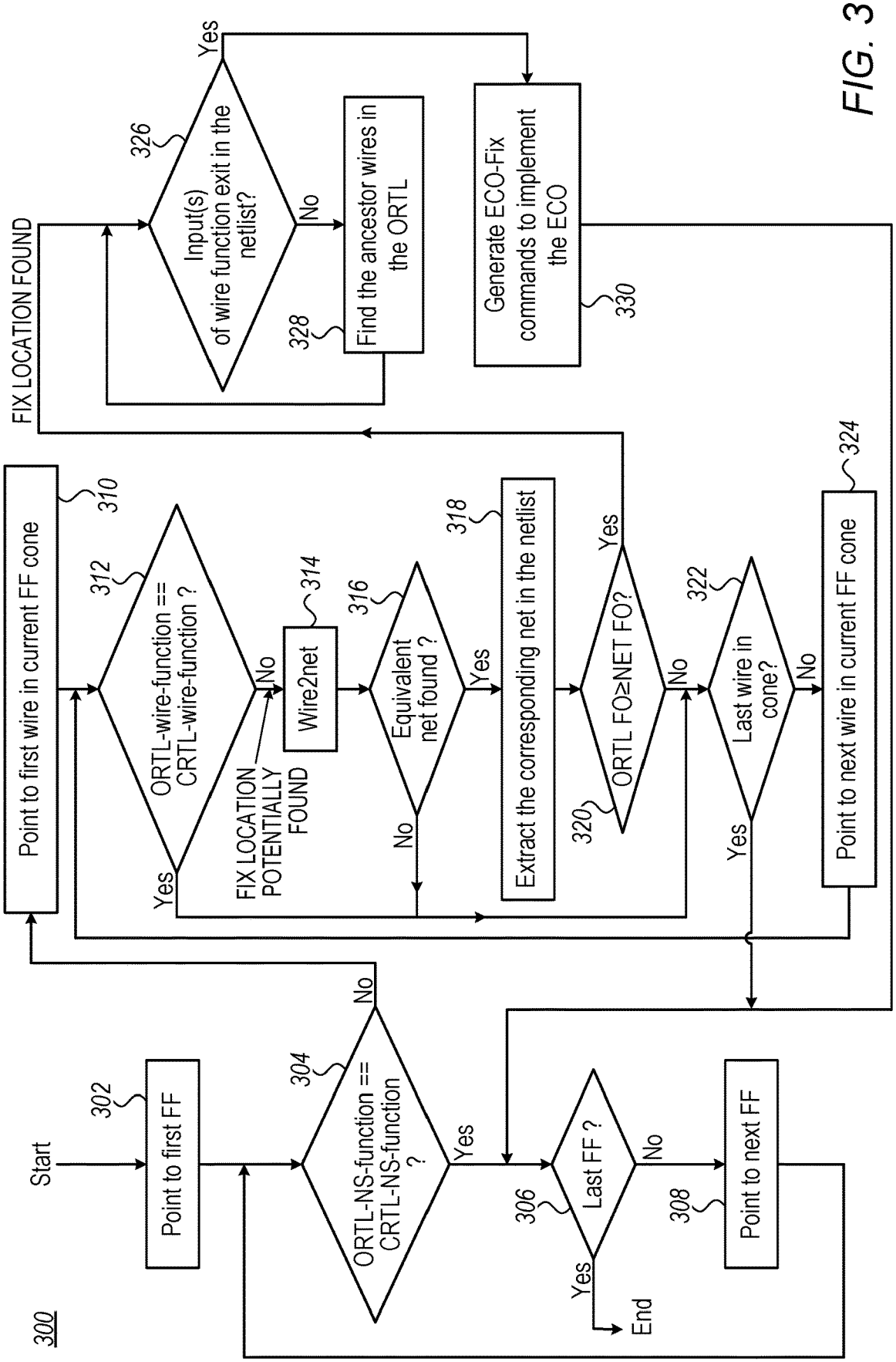
FIG. 3 is a flow chart that schematically illustrates a method for automatic bug fixing, in accordance with an embodiment of the present invention.

FIG. 3 is a flow-chart 300 that schematically illustrates a method for automatic bug fixing, in accordance with an embodiment of the present invention. The flow chart is executed by processor 28 of Computer 26 (FIG. 1).

The method starts at a Pointing to First Flip-Flop step 302, wherein processor 28 sets a first pointer (for example, a computer register) to point to the first flip-flop in both Original-RTL 34 and Corrected-RTL 36 (FIG. 1). Next, in a Checking Next-State-Equivalence step 304, processor 28 checks if the next-state functions of the Flip-Flop that the first pointer points to are equivalent in the Original RTL and the Corrected RTL, for example by running an Equivalence-Check test.

If, in Step 304, the next-state functions of the flip flop in the Original RTL and in the Corrected RTL are found to be equivalent, processor 28 enters a Checking-Last-FF Step 306, and, if the flip flop that the first pointer points to is the last one, the flow ends. If the Flip Flop is not the last one, processor 28 will enter a Pointing-to-Next-FF step 308, wherein the processor will increment the first pointer to point to the next Flip-Flop, and then reenter step 304.

If, in step 304, the next-state functions of the flip-flop in the Original RTL and in the Corrected RTL are found to be not equivalent, processor 28 will enter a Pointing-to-First-Wire-in-Cone step 310, wherein a second pointer (for example, a second computer register) will be set to point at the first wire in the logic cone of the flip-flop that the first pointer points to, and then enter a Comparing-Wire-Function step 312.

In Step 312, processor 28 will check if the wires that the second pointer points to in the Original-RTL and the Corrected-RTL are equivalent, using an Equivalence-Check software. If, in Step 312, the wires are equivalent, the processor will enter a Checking-for-Last-Wire-in-Cone Step 322, wherein it will check if the wire pointed to by the second pointer is the last wire in the cone of the flip flop pointed to by the first pointer, and enter Step 308 if it is.

If, in Step 312, processor 28 finds that the wires that the second pointer points to in the Original-RTL and in the Corrected-RTL are not equivalent, a Fix Location is potentially found (that is—a fix in the netlist may be done at this wire). According to embodiments of the present invention, a wire that fails the equivalence check of step 312 may be a fix-location if a) there is an equivalent net of that wire in the netlist, and b) the fanout of the net in the netlist is equivalent to the fanout of the wire in the RTL. Therefore, to find a Fix Location, processor 28 first goes through steps 314, 316, 318, and 320 (described below).

If, in Step 312, the wire functions in the Original RTL and the Corrected RTL are not equivalent, processor 28 will enter a Wire-to-Net step 314, wherein the processor may run a WIRE2NET program that finds a net in the netlist that corresponds to the wire pointed to by the second pointer (other suitable software programs, which find the net that corresponds to a wire in the RTL, may be used).

Synthesis tools may optimize the RTL and, consequently, there may not be an equivalent net to the wire that the second pointer points to. In that case, in a Checking-for-Equivalent-Net step 316, processor 28 will find out that there is no equivalent net, and enter a Checking-Last Wire step 322, wherein the processor will check if the wire pointed to by the second pointer is the last wire in the Logic Cone of the flip-flop pointed to by the first pointer. If the second pointer points to the last wire, processor 28 will enter step 306, whereas if the second pointer does not point to the last wire, the processor will enter a Pointing-to-Next-Wire step 324; wherein processor 28 will increment the second pointer, and then reenter step 312.

If, in Step 316, processor 28 finds that an equivalent net to the wire pointed to by the second pointer exists in the netlist, the processor will enter an Extracting-Corresponding-Net step 318, wherein the processor will get the net corresponding to the wire pointed to by the second pointer. The processor will then enter a Comparing Fanout step 320, wherein processor 28 will compare the fanout of the wire in the Original RTL to the fanout of the net in the netlist, and check that the fanout of the net in the netlist is contained in the fanout of the wire in the Original RTL (that is—the flip-flops in which the net in the netlist end are part of the group of flip flops in which the wire in the RTL ends). If the fanout of the net in the netlist is not contained in the fanout of the wire in the Original RTL, a fix location is not yet found, and the processor will enter step 322, to check the next wire in the cone.

If, in Step 320, the fanouts end in the same Flip-Flop, a Fix Location is found, and processor 28 will enter a Checking-Existence-of-Wire-Inputs step 326, wherein the existence of the inputs of the wire function in the netlist are checked using, for example, WIRE2NET (other suitable software may be used).

If, in step 326, processor 28 finds that there is no net corresponding to the function of the input of the wire in the netlist, processor 28 will enter a Finding-Ancestor-Wires step 328, wherein it will check in the Original RTL what are the inputs that generate the missing inputs of the wire, and then reenter step 326, to check if the inputs of the inputs exist in the netlist.

Processor 28 will remain in the loop comprising steps 326 and 328 until it finds inputs that exist in the netlist. When, in Step 326, processor 28 finds that the input does exist, the processor will enter a Generating ECO-Fix-Command Step 330. As the base of the cone (i.e. flip-flops and external inputs) does exist in the netlist, the processor will always exit the loop comprising Steps 326 and 328 and enter Step 330.

In Step 330, processor 28 generates ECO-Fix commands, to directly implement the fix at the netlist. After Step 330 the processor re-enters Checking-Last-FF Step 306, to check if there are more flip-flops that need to be fixed.

The flow chart shown in FIG. 3 is an example that is depicted purely for the sake of conceptual clarity. Alternative embodiments may comprise variations of the flow chart, including (but not limited to) parallel execution of parts of the flow chart, execution of the flow chart or parts of the flow chart as part of other flow charts, merging of steps of the flow chart and dividing of steps of the flow chart; the flow chart may be executed by a computer such as computer 26, or by two or more computers; and/or some of the functions of the flow chart may be executed or accelerated by hardware, for example.

Although the embodiments described herein mainly address ECO bug fixing, the methods and systems described herein can also be used in other applications.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus for Integrated Circuit (IC) design, comprising:
   a memory, configured to store an original Register Transfer Level (RTL) model of at least part of the IC, a corrected RTL model of the at least part of the IC, and a translation of the original RTL model into a netlist; and
   a processor, configured to:
      identify in the original RTL model a flip-flop having a next-state function that is not equivalent to a corresponding next-state function of a corresponding flip-flop in the Corrected RTL model;
      find a wire, which is the earliest ancestor wire of the identified flip-flop for which there is no equivalence between the original RTL model and the corrected RTL model;
      check whether the found wire in the corrected RTL model has an equivalent net in the netlist;
      upon finding that the wire has no equivalent net in the netlist, identify one or more ancestor wires of the wire, which do have equivalent nets in the netlist; and
      modify the netlist, at least at the equivalent nets, to match the corrected RTL model.

2. The apparatus according to claim 1, wherein the processor is configured to modify the netlist by executing one or more ECO-fix commands.

3. The apparatus according to claim 1, wherein the processor is configured to identify the flip-flop by sequentially traversing the original RTL model.

4. The apparatus according to claim 1, wherein the processor is configured to find the wire by recursively traversing a logic cone of the identified flip-flop in the original RTL model.

5. The apparatus according to claim 1, wherein the processor is configured to identify the ancestor wires of the wire by recursively traversing the original RTL model.

6. A method for Integrated Circuit (IC) design, comprising:
storing in a memory an original Register Transfer Level (RTL) model of at least part of the IC, a corrected RTL model of the at least part of the IC, and a translation of the original RTL model into a netlist;
identifying in the original RTL model a flip-flop having a next-state function that is not equivalent to a corresponding next-state function of a corresponding flip-flop in the Corrected RTL model;
finding a wire, which is the earliest ancestor wire of the identified flip-flop for which there is no equivalence between the original RTL model and the corrected RTL model;
checking whether the found wire in the corrected RTL model has an equivalent net in the netlist;
upon finding that the wire has no equivalent net in the netlist, identifying one or more ancestor wires of the wire, which do have equivalent nets in the netlist; and
modifying the netlist, at least at the equivalent nets, to match the corrected RTL model.

7. The method according to claim 6, wherein modifying the netlist comprises executing one or more ECO-fix commands.

8. The method according to claim 6, wherein identifying the flip-flop comprises sequentially traversing the original RTL model.

9. The method according to claim 6, wherein finding the wire comprises recursively traversing a logic cone of the identified flip-flop in the original RTL model.

10. The method according to claim 6, wherein identifying the ancestor wires of the wire comprises recursively traversing the original RTL model.

11. A computer software product, the product comprising a tangible non-transitory computer-readable medium in which program instructions are stored, which instructions, when read by a processor, cause the processor to:
store in a memory an original Register Transfer Level (RTL) model of at least part of the IC, a corrected RTL model of the at least part of the IC, and a translation of the original RTL model into a netlist;
identify in the original RTL model a flip-flop having a next-state function that is not equivalent to a corresponding next-state function of a corresponding flip-flop in the Corrected RTL model;
find a wire, which is the earliest ancestor wire of the identified flip-flop for which there is no equivalence between the original RTL model and the corrected RTL model;
check whether the found wire in the corrected RTL model has an equivalent net in the netlist;
upon finding that the wire has no equivalent net in the netlist, identify one or more ancestor wires of the wire, which do have equivalent nets in the netlist; and
modify the netlist, at least at the equivalent nets, to match the corrected RTL model.

12. The apparatus according to claim 1, wherein the processor is configured to sequentially compare next state functions of all flip-flops in the original RTL model to next state functions of the flip-flops in the corrected RTL model, and when a next-state function of a flip-flop in the corrected RTL model is not equal to a next-state function of a corresponding flip-flop in the original RTL, to compare all wires in cones of the flip-flop in the corrected RTL with those of the original RTL, disregarding wires that do not have an equivalent net in the netlist.

\* \* \* \* \*